United States Patent
Tsuji

(10) Patent No.: US 8,558,338 B2
(45) Date of Patent: Oct. 15, 2013

(54) SOLID-STATE IMAGING DEVICE AND METHOD FOR MANUFACTURING THE SAME

(75) Inventor: Shoichiro Tsuji, Shiga (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/449,369

(22) Filed: Apr. 18, 2012

(65) Prior Publication Data

US 2012/0267744 A1    Oct. 25, 2012

(30) Foreign Application Priority Data

Apr. 22, 2011   (JP) .................. 2011-096166

(51) Int. Cl.
*H01L 31/18*   (2006.01)
(52) U.S. Cl.
USPC ............. 257/432; 257/E31.127; 438/70
(58) Field of Classification Search
USPC ............ 257/431–466, E31.127; 438/70, 73
See application file for complete search history.

(56) References Cited

U.S. PATENT DOCUMENTS

| 2006/0158547 A1 | 7/2006 | Komatsu et al. |
| 2010/0060756 A1 | 3/2010 | Inuiya |
| 2010/0207225 A1* | 8/2010 | Masuda ................ 257/432 |
| 2010/0245638 A1 | 9/2010 | Ota |

FOREIGN PATENT DOCUMENTS

| JP | 03-255404 | 11/1991 |
| JP | 03-282403 | 12/1991 |
| JP | 2006-295125 | 10/2006 |
| JP | 2006-351775 | 12/2006 |
| JP | 2009-111225 | 5/2009 |
| JP | 2010-067828 | 3/2010 |
| JP | 2010-232537 | 10/2010 |

\* cited by examiner

*Primary Examiner* — Tucker Wright
(74) *Attorney, Agent, or Firm* — Panasonic Patent Center

(57) ABSTRACT

There are provided semiconductor substrate, ground layer formed on semiconductor substrate and having an upper surface corresponding to pixel region, the upper surface being lower than an upper surface corresponding to peripheral circuit region, a plurality of color filters disposed two-dimensionally on the upper surface corresponding to pixel region in ground layer, and partition wall provided between color filters. In a section which is orthogonal to the upper surface corresponding to pixel region in ground layer, an occupied area of partition wall provided in outer portion disposed in contact with peripheral circuit region is smaller than that of partition wall provided in central portion of pixel region.

8 Claims, 10 Drawing Sheets

SOLID-STATE IMAGING DEVICE AND METHOD FOR MANUFACTURING THE SAME

BACKGROUND

1. Technical Field

The present invention relates to a solid-state imaging device and a method for manufacturing the same, and more particularly to a solid-state imaging device using a partition wall between color filters and a method for manufacturing the same.

2. Description of the Related Art

In a solid-state imaging device in which color filters are formed corresponding to light receiving parts formed on a semiconductor substrate respectively, there is the technique for preventing light incident obliquely to the color filters from being incident on the other adjacent color filters or light receiving parts. For example, there is proposed a solid-state imaging device using a partition wall between the color filters (for instance, Unexamined Japanese Patent Publication No. 3-282403).

FIG. 11 is a sectional view showing a solid-state imaging device described in the Unexamined Japanese Patent Publication No. 3-282403.

Solid-state imaging device 900 described in the Unexamined Japanese Patent Publication No. 3-282403 has a structure in which flattened layer 903 is formed on light receiving part 901 and filters 907 to 910 formed above light receiving part 901 are divided through organic silicon material layer 904. In other words, a partition wall to be organic silicon material layer 904 is disposed between filters 907 to 910 corresponding to respective light receiving parts 901.

By the structure, light incident obliquely to light receiving part 901 is reflected by partition wall 904 or is incident on partition wall 904 and is thus absorbed into an inner part so that the light is prevented from reaching adjacent light receiving part 901.

SUMMARY

However, solid-state imaging device 900 described in the Unexamined Japanese Patent Publication No. 3-282403 has a problem in that filters 907 to 910 having a uniform thickness cannot be obtained and a sensitivity is thus uneven, resulting in a color irregularity or a sensitivity unevenness.

In other words, the solid-state imaging device has a pixel region and a peripheral circuit region, and a thickness of a wiring layer formed on a semiconductor substrate is greater in the peripheral circuit region than that in the pixel region. Consequently, a great step is generated between the pixel region and the peripheral circuit region over a surface of the wiring layer. A partition wall is formed on a surface of the pixel region in the wiring layer or a surface of a flattened layer provided in the pixel region over the wiring layer.

An upper surface of an organic material is inclined from the peripheral circuit region to the pixel region by an influence of a step when the organic material is applied to form a color filter. As a result, a thickness of the color filter in the pixel region is increased in the vicinity of the peripheral circuit region.

The present invention provides a solid-state imaging device capable of preventing a film thickness of a color filter from being ununiform and a method for manufacturing the same.

A solid-state imaging device according to the present invention includes a semiconductor substrate, and a ground layer formed on the semiconductor substrate and having an upper surface corresponding to a pixel region, the upper surface being lower than an upper surface corresponding to a peripheral circuit region. The device includes a plurality of color filters disposed two-dimensionally on the upper surface of the ground layer corresponding to the pixel region, and a partition wall provided between the color filters. An occupied area of the partition wall provided in an outer portion of the pixel region adjacent to the peripheral circuit region is smaller than that of the partition wall provided in a central portion of the pixel region in a section which is orthogonal to the upper surface of the ground layer corresponding to the pixel region.

Moreover, a method for manufacturing a solid-state imaging device according to the present invention serves to manufacture a solid-state imaging device including a plurality of color filters and a partition wall, the color filters being disposed two-dimensionally on an upper surface of a ground layer corresponding to a pixel region, the ground layer having a structure in which the upper surface corresponding to the pixel region is lower than an upper surface corresponding to a peripheral circuit region. The method includes a partition wall forming step of forming the partition wall in a state in which an occupied area of the partition wall provided in an outer portion of the pixel region adjacent to the peripheral circuit region is smaller than that of the partition wall provided in a central portion of the pixel region in a section which is orthogonal to the upper surface of the ground layer corresponding to the pixel region, and a filter forming step of forming the color filter between the partition walls.

Alternatively, the solid-state imaging device according to the present invention includes a semiconductor substrate and a ground layer formed on the semiconductor substrate and having an upper surface corresponding to a pixel region, the upper surface being lower than an upper surface corresponding to a peripheral circuit region. The device includes a plurality of color filters disposed two-dimensionally on the upper surface of the ground layer corresponding to the pixel region, and a partition wall provided between the color filters which are present in a central portion of the pixel region excluding an outer portion of the pixel region adjacent to the peripheral circuit region.

Furthermore, the method for manufacturing a solid-state imaging device according to the present invention serves to manufacture a solid-state imaging device including a plurality of color filters and a partition wall, the color filters being disposed two-dimensionally on an upper surface of a ground layer corresponding to a pixel region, the ground layer having a structure in which the upper surface corresponding to the pixel region is lower than an upper surface corresponding to a peripheral circuit region. The method includes a partition wall forming step of forming the partition walls in a central portion of the pixel region excluding an outer portion adjacent to the peripheral circuit region, and a filter forming step of forming the color filter between the partition walls in the outer portion and the central portion.

According to the solid-state imaging device and the method for manufacturing the same in accordance with the present invention, a volume of the partition wall is set to be smaller in the outer portion than that in the central portion. Consequently, it is possible to ensure a space for storing a color filter forming material in the outpour portion of the pixel region. Thus, an inclination of a surface of the color filter from the outer portion to the central portion is reduced so that a film thickness of the color filter can be prevented from being ununiform.

Moreover, it is preferable that an area of the partition wall in the outer portion should be smaller than that of the partition wall in the central portion in the section, and the partition wall should be erected on the upper surface of the ground layer corresponding to the pixel region and a width of the partition wall in the outer portion of the pixel region should be smaller than that of the partition wall in the central portion in the section. Alternatively, it is preferable that the partition wall should be erected on the upper surface of the ground layer corresponding to the pixel region, and a height of the partition wall in the outer portion of the pixel region should be smaller than that of the partition wall in the central portion of the pixel region in the section.

Furthermore, it is preferable that the area of the partition wall in the outer portion of the pixel region should be gradually reduced toward the peripheral circuit region in the section. Alternatively, it is preferable that the outer portion of the pixel region should be extended along the peripheral circuit region and should have a width which is equal to or greater than 1 μm and is equal to or smaller than 100 μm.

DETAILED DESCRIPTION OF THE PREFERRED EMBODIMENT

A solid-state imaging device and a method for manufacturing the same according to exemplary embodiments of the present invention will be described below with reference to the drawings. Preferred examples of a material and a numeric value which are used in the present invention are only illustrative in the exemplary embodiments, and the present invention is not restricted thereto. Moreover, changes can be properly made without departing from the scope of the technical thought of the present invention. In addition, a combination with the other exemplary embodiments can be made within a range in which an inconsistency is not caused.

First Exemplary Embodiment

Figure 1:
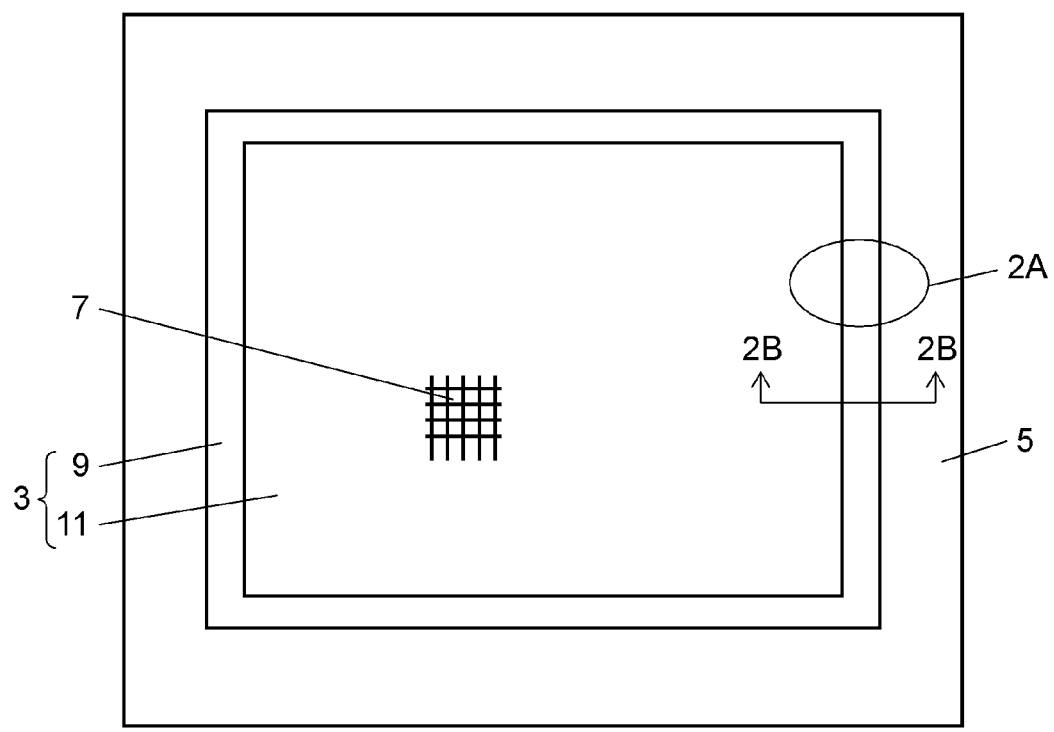
FIG. 1 is a plan view showing a solid-state imaging device according to a first exemplary embodiment.
Figure 2A:
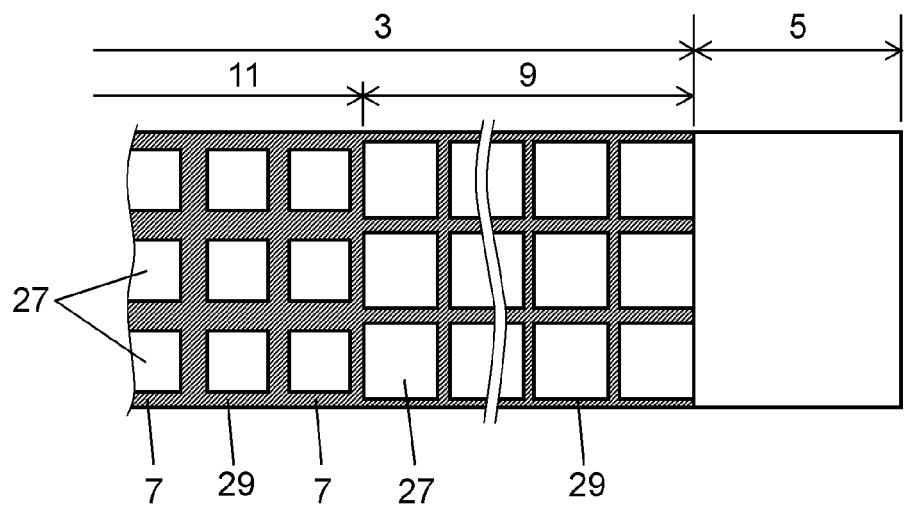
FIG. 2A is an enlarged view showing a 2A part of FIG. 1 and a plan view showing a state in which a microlens is removed.
Figure 2B:
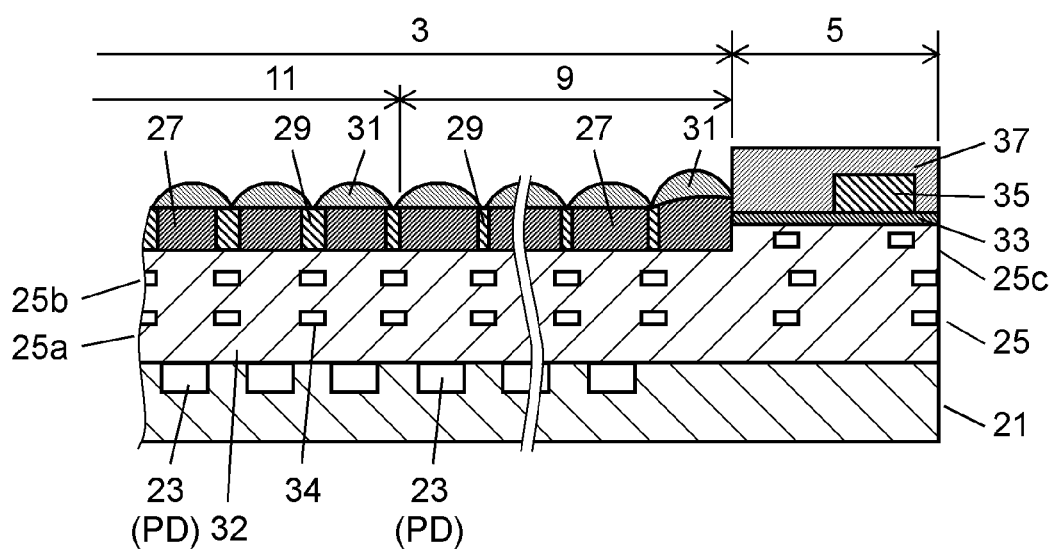
FIG. 2B is a sectional view showing a state in which the microlens is formed along a 2B-2B line in FIG. 1.

Solid-state imaging device 1 according to the present exemplary embodiment includes semiconductor substrate 21, and wiring layer 25 to be a ground layer which is formed on semiconductor substrate 21 and has an upper surface corresponding to pixel region 3, the upper surface being lower than an upper surface corresponding to peripheral circuit region 5 as shown in FIGS. 1, 2A and 2B. There are provided a plurality of color filters 27 disposed two-dimensionally on the upper surface corresponding to pixel region 3 in wiring layer 25 to be the ground layer and partition wall 29 disposed between respective color filters 27. In an orthogonal section to the upper surface corresponding to pixel region 3 in wiring layer 25 to be the ground layer, an occupied area of partition wall 29 disposed in invalid pixel region 9 to be an outer portion of the pixel region 3 adjacent to peripheral circuit region 5 is smaller than that of partition wall 29 disposed in valid pixel region 11 to be a central portion of pixel region 3.

1. Whole Structure

FIG. 1 is a plan view showing solid-state imaging device 1 according to a first exemplary embodiment.

Solid-state imaging device 1 takes a square shape seen on a plane (a rectangular shape) as shown in FIG. 1, for example. Solid-state imaging device 1 has pixel region 3 on a center and peripheral circuit region 5 around pixel region 3, respectively.

Although peripheral circuit region 5 is present on an outside along a full periphery of pixel region 3 taking the square shape, peripheral circuit region 5 may be provided within a range in a part of the periphery of pixel region 3.

A plurality of pixel parts 7 is formed two-dimensionally in pixel region 3. Pixel region 3 includes invalid pixel region 9 in an outer peripheral portion thereof and valid pixel region 11 in an inner portion of invalid pixel region 9.

Peripheral circuit region 5 has a circuit for outputting, to an external device, a pixel signal sent from pixel region 3, particularly, pixel part 7 in valid pixel region 11 or supplying a power to pixel part 7 in pixel region 3.

Herein, pixel parts 7 are formed in a matrix in pixel region 3.

FIG. 2A is an enlarged view showing a 2A part in FIG. 1 and is a plan view showing a state in which microlens 31 is removed. FIG. 2B is a sectional view showing a state in which microlens 31 is formed along a 2B-2B line of FIG. 1. A section is orthogonal to a surface on which color filters 27 or the like is formed.

Semiconductor substrate 21 has light receiving part 23 two-dimensionally corresponding to each pixel part 7 of pixel region 3. Wiring layer 25 is formed on semiconductor substrate 21. Wiring layer 25 has a multilayer structure as will be described below. Wiring layer 25 has a two-layer structure in pixel region 3 and a three-layer structure in peripheral circuit region 5.

In pixel region 3 on wiring layer 25, a plurality of color filters 27 is formed corresponding to respective pixel parts 7, and partition wall 29 is formed corresponding to a portion between respective color filters 27. Herein, "formed" means "erected". Microlens 31 is formed corresponding to each pixel part 7 over color filter 27 and partition wall 29 as shown in FIG. 2B.

On wiring layer 25 of peripheral circuit region 5, interlayer insulating film 33 is formed. Pad wiring 35 is formed on interlayer insulating film 33. Protective film 37 is formed on a region of interlayer insulating film 33 in which pad wiring 35 is not formed, and on the pad wiring 35.

2. Each Structure
(1) Semiconductor Substrate

A silicon substrate is utilized for semiconductor substrate 21, for example, and photodiode PD to be light receiving part 23 is formed corresponding to each pixel part 7. In the case in which solid-state imaging device 1 is of a CMOS type, there are further provided a transfer transistor, a reset transistor, an amplifying transistor and the like.

If pixel part 7 has an n-pixel 1-cell structure (n is a natural number), each pixel part 7 has n photodiodes PDs, n transfer transistors, a single reset transistor and a single amplifying transistor.

Photodiode PD stores an electric charge through a photoelectric conversion in response to light which is received. The transfer transistor transfers the electric charge stored in photodiode PD to an electric charge storing part (a floating diffusion) in response to a transfer control signal. The reset transistor initializes the electric charge storing part in response to a reset signal. The amplifying transistor outputs a signal corresponding to a level of the electric charge stored in the electric charge storing part.

(2) Wiring Layer

Wiring layer 25 is provided with a wiring for electrically connecting each pixel part 7 to the peripheral circuit (not shown) or the like. Wiring layer 25 of pixel region 3 has a two-layer structure including first layer 25a and second layer 25b, and wiring layer 25 of peripheral circuit region 5 has a three-layer structure including first layer 25a, second layer 25b and third layer 25c.

A close layer to semiconductor substrate 21 is first layer 25a. Moreover, it is apparent that a single wiring layer may be provided and pixel region 3 and peripheral circuit region 5 may have the equal number of layers.

Each of layers 25a, 25b and 25c includes insulating film 32 and wiring 34 in insulating film 32, for example, and includes a diffusion preventing film for wiring 34 if necessary. Wiring 34 is a metal wire. For this reason, wiring 34 is formed between adjacent photodiodes PDs so as not to block light incident on photodiode PD.

(3) Color Filter

Color filter 27 selects the light incident on photodiode PD based on a wavelength. Color filter 27 is formed like an island (in a state in which it is individually formed corresponding to each pixel part).

(4) Partition Wall

Partition wall 29 prevents light incident from microlens 31 or color filter 27 from being incident on adjacent pixel part 7.

Partition wall 29 takes a shape of a grid (a mesh) in which a portion corresponding to color filter 27 is opened as seen on a plane. A width of a section in partition wall 29 is varied between valid pixel region 11 and invalid pixel region 9 as will be described below. For this reason, there is taken the shape of the grid in which a size of the opening is varied depending on a place. In a sectional view of FIG. 2B, each partition wall 29 is seen to be independent.

Herein, partition wall 29 takes a sectional shape of a rectangle as a whole. A width of partition wall 29 in valid pixel region 11 is greater than that of partition wall 29 in invalid pixel region 9 as shown in FIGS. 2A and 2B.

In other words, in a cross section, an occupied area of partition wall 29 in invalid pixel region 9 is smaller than that of partition wall 29 in valid pixel region 11.

Partition wall 29 is constituted by a material having a lower refractive index than a material constituting color filter 27. For this reason, light advancing in an oblique direction in color filter 27 is reflected when the light reaches a surface of partition wall 29.

(5) Microlens

Microlens 31 serves to collect light incident from above into photodiode PD of corresponding pixel part 7.

Herein, microlens 31 is a convex lens protruded in such a direction as to separate from semiconductor substrate 21. Herein, microlens 31 is an integrated product having a lens part disposed on photodiode PD and a coupling part for coupling each lens part over partition wall 29. In the microlens, it is sufficient that at least a part (the lens part) having a light collecting function is formed on photodiode PD, and there may be employed a structure in which the lens part is isolated.

3. Example
(1) Semiconductor Substrate and Wiring Layer

Semiconductor substrate 21 and wiring layer 25 have the same structures as those in the related art, and brief description will be given.

A silicon substrate is utilized for semiconductor substrate 21, for example. In wiring layer 25, silicon oxide to be an insulating material can be utilized as insulating film 32, for example. An aluminum wire can be utilized as wiring 34, for example.

A step between a surface of pixel region 3 and that of peripheral circuit region 5 in wiring layer 25 is 100 [nm] to 400 [μm].

Photodiodes PDs formed in semiconductor substrate 21 have an interval which is equal to or smaller than 0.8 [μm] and a cell size of 1.4 [μm]. In invalid pixel region 9, moreover, it is sufficient that at least one pixel part 7 is formed on an outer periphery of valid pixel region 11, and 10 pixel parts 7 are formed. In other words, a width of invalid pixel region 9, that is, a distance between valid pixel region 11 and peripheral circuit region 5 is 15 [μm] to 20 [μm].

(2) Interlayer Insulating Film, Pad Wiring, Protective Film

Interlayer insulating film 33 is a silicon oxide film, for example, and has a film thickness of 50 [nm] to 400 [nm]. Pad wiring 35 is an aluminum wire, for example, and has a film thickness of 200 [nm] to 800 [nm]. Protective film 37 is a silicon oxide film, for example, and has a film thickness of 400 [nm] to 1100 [nm].

A step between a surface of protective film 37 and that of wiring layer 25 in pixel region 3 is 750 [nm] to 2700 [nm]. In the present exemplary embodiment, since interlayer insulating film 33 is formed, the step is great, that is, 2000 [nm].

(3) Color Filter

Herein, color filter 27 has three types of red (R), green (G) and blue (B), and is subjected to a Bayer arrangement, for example. Color filter 27 for each color is obtained by mixing a pigment for each color into an acrylic resin material, for example. In this case, color filter 27 has a refractive index of 1.5 to 1.7. Color filter 27 has a film thickness of 300 [nm] to 1000 [nm].

(4) Partition Wall

For partition wall 29, an acrylic resin containing silica oxide is utilized, for example. Partition wall 29 has a height of 300 [nm] to 1000 [nm] and a width of 50 [nm] to 500 [nm]. In the case in which the acrylic resin is utilized, a refractive index is equal to or lower than 1.5.

Detailed description will be given. The height of partition wall 29 is 800 [nm] which is same in a whole range of pixel region 3. For the width of partition wall 29, a width in valid pixel region 11 is 200 [nm] to 250 [nm] and a width in invalid pixel region 9 is 50 [nm] to 200 [nm]. Partition wall 29 in valid pixel region 11 is greater than partition wall 29 in invalid pixel region 9.

(5) Effect

By a difference in the width of partition wall 29 in pixel region 3, it is possible to obtain an effect capable of causing the film thickness of color filter 27 to be uniform for reasons which will be described below.

More specific description will be given. In the case in which the width (occupied area) of the partition wall 29 in the pixel region 3 is set to be constant, an unevenness of the film thickness of color filter 27 is not caused by the influence of the step between pixel region 3 and peripheral circuit region 5 in wiring layer 25 (a uniform film thickness can be obtained) when the number of pixel parts 7 of invalid pixel region 9 between valid pixel region 11 and peripheral circuit region 5 is greater than 10.

On the other hand, in the case in which the width (occupied area) of partition wall 29 in invalid pixel region 9 is set to be smaller than the width (occupied area) of partition wall 29 in valid pixel region 11, color filter 27 having a uniform film thickness can be obtained with approximately 10 pixel parts 7 of invalid pixel region 9 between valid pixel region 11 and peripheral circuit region 5.

4. Manufacturing Method

FIGS. 3A to 5B are sectional views for explaining a method for manufacturing solid-state imaging device 1 according to the present exemplary embodiment. The explanation relates to the method for manufacturing solid-state imaging device 1 described in the example mentioned above and indicates an example of the manufacturing method according to the present invention.

Figure 3A:
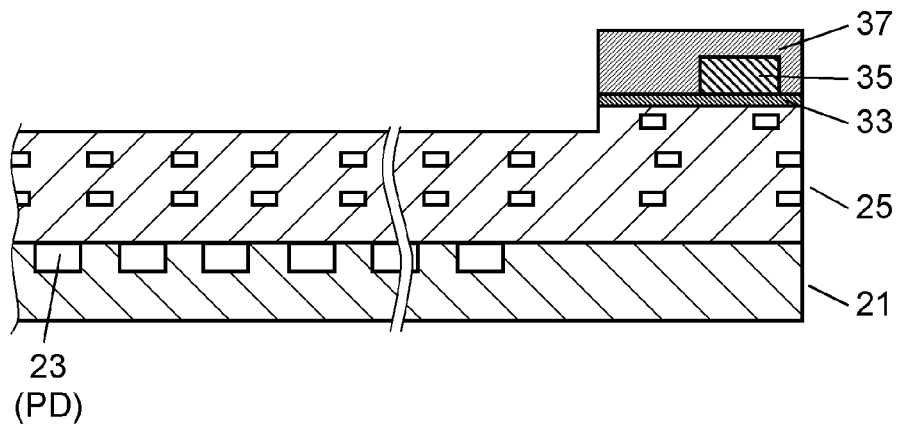
FIG. 3A is a sectional view for explaining a method for manufacturing the solid-state imaging device according to the first exemplary embodiment.

(a) As shown in FIG. 3A, wiring layer 25 is laminated (formed) on an upper surface of semiconductor substrate 21 obtained by forming a plurality of photodiodes PDs or the like in a silicon substrate or the like and interlayer insulating film 33, pad wiring 35 and protective film 37 are then formed.

Interlayer insulating film 33, pad wiring 35 and protective film 37 are obtained by forming an insulating film for interlayer insulating film 33 and a metal film for pad wiring 35, then removing the metal film corresponding to pad wiring 35 and the insulating film corresponding to interlayer insulating film 33 through etching or the like, thereafter forming an insulating film for protective film 37, and subsequently removing the insulating film corresponding to protective film 37 through the etching or the like, for example.

Figure 3B:
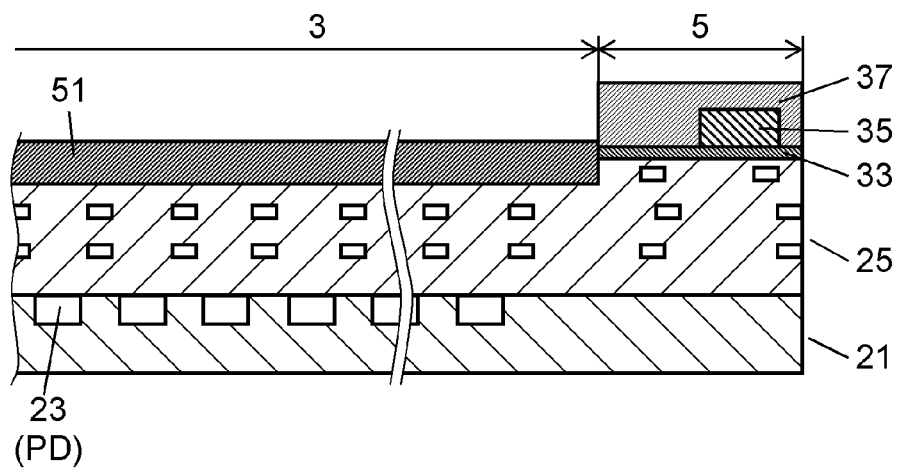
FIG. 3B is a sectional view for explaining the method for manufacturing the solid-state imaging device according to the first exemplary embodiment.

(b) As shown in FIG. 3B, partition wall forming material 51 having a medium of an acrylic resin obtained by mixing silica oxide to be a material of partition wall 29 is applied to pixel region 3 on wiring layer 25. Partition wall forming material 51 is applied by spin coating (spin coat), for example. The acrylic resin is a positive type photosensitive resin to be dissolved by an alkali phenomenon.

Figure 3C:
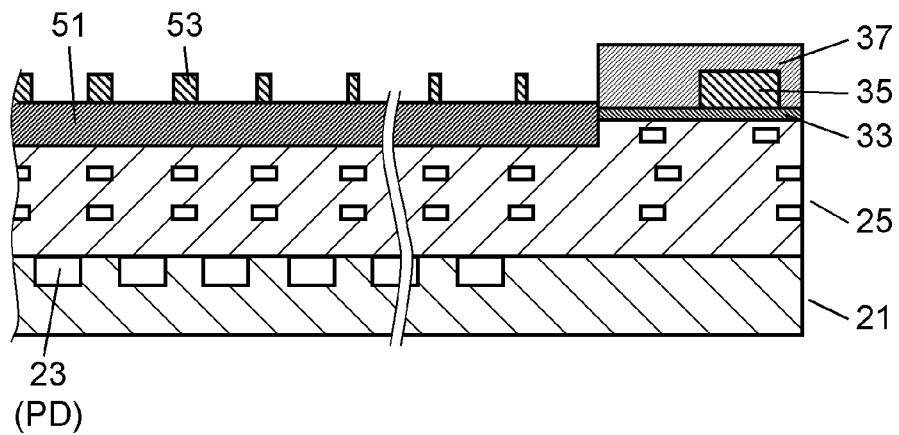
FIG. 3C is a sectional view for explaining the method for manufacturing the solid-state imaging device according to the first exemplary embodiment.
Figure 4A:
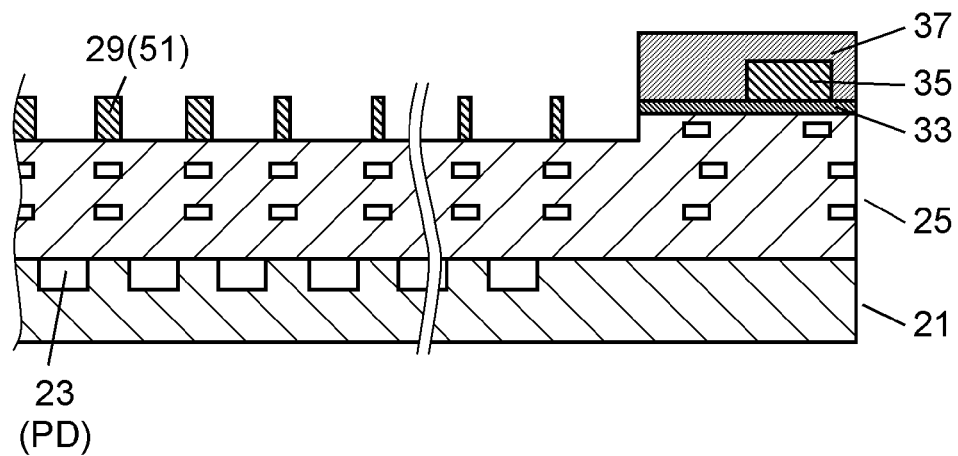
FIG. 4A is a sectional view for explaining the method for manufacturing the solid-state imaging device according to the first exemplary embodiment.

(c) As shown in FIG. 3C, an exposure and a development are carried out in a state in which a mask (negative film) 53 having an opened portion other than a portion corresponding to the partition wall is provided on partition wall forming material 51 applied onto wiring layer 25. As shown in FIG. 4A, consequently, partition wall forming material 51 in a portion corresponding to the opening of the mask is removed so that partition wall 29 is formed.

Figure 4B:
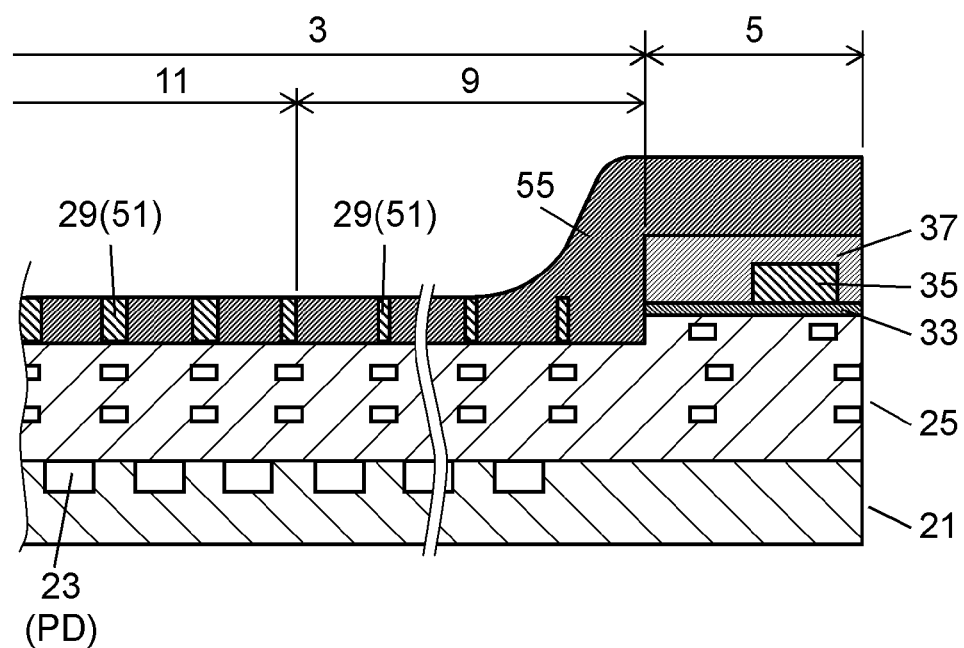
FIG. 4B is a sectional view for explaining the method for manufacturing the solid-state imaging device according to the first exemplary embodiment.

(d) As shown in FIG. 4B, an acrylic resin 55 containing a pigment for a color filter (which will also be referred to as a film forming material) is applied onto wiring layer 25 in pixel region 3 and an upper surface of protective film 37. The pigment corresponds to each color.

In this case, the upper surface of protective film 37, that is, the upper surface of peripheral circuit region 5 is higher than that of wiring layer 25 in pixel region 3. For this reason, acrylic resin 55 provided on protective film 37 flows onto wiring layer 25 in pixel region 3 so that a surface of acrylic resin 55 is inclined from peripheral circuit region 5 toward pixel region 3.

Partition wall 29 formed in a region of pixel region 3 which is close to peripheral circuit region 5, that is, invalid pixel region 9 has a smaller width than partition wall 29 formed in valid pixel region 11.

For this reason, in invalid pixel region 9, a space capable of storing acrylic resin 55 is larger than that in the case in which a partition wall having an equal width to that of partition wall 29 of valid pixel region 11 is formed in a whole range of pixel region 3.

In a region of invalid pixel region 9 which is close to peripheral circuit region 5, consequently, a larger quantity of acrylic resin 55 can be stored corresponding to a reduction in a size of partition wall 29 in invalid pixel region 9. A larger quantity of acrylic resin 55 can be stored so that an extra resin to cause acrylic resin 55 to be thickened is stored between partition walls 29. Accordingly, a film thickness of acrylic resin 55 can be set to be constant from the region in invalid pixel region 9 which is close to peripheral circuit region 5.

Figure 5A:
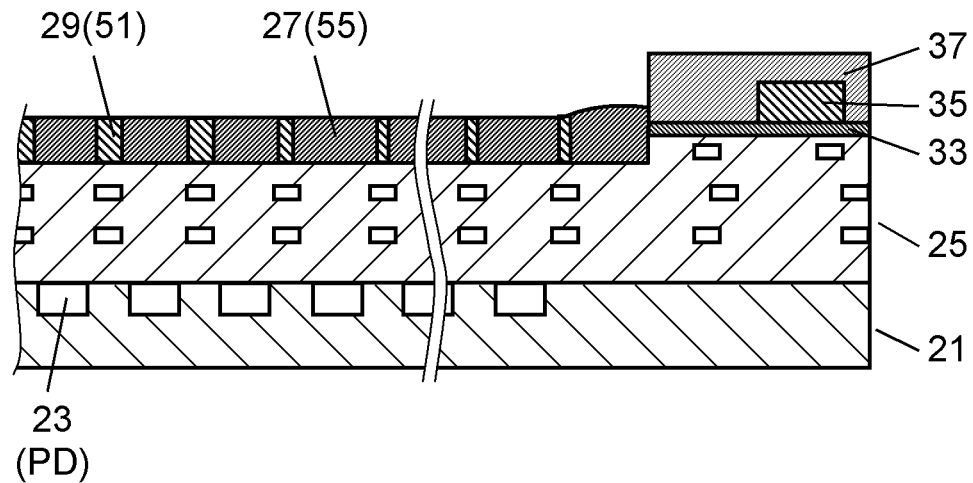
FIG. 5A is a sectional view for explaining the method for manufacturing the solid-state imaging device according to the first exemplary embodiment.

(e) As shown in FIG. 5A, acrylic resin 55 applied corresponding to each color of color filter 27 is formed so as to be disposed between predetermined partition walls 29. More specifically, it is possible to execute the formation by carrying out the exposure and development using a mask in which a portion other than a position corresponding to each color is opened (not shown).

Figure 5B:
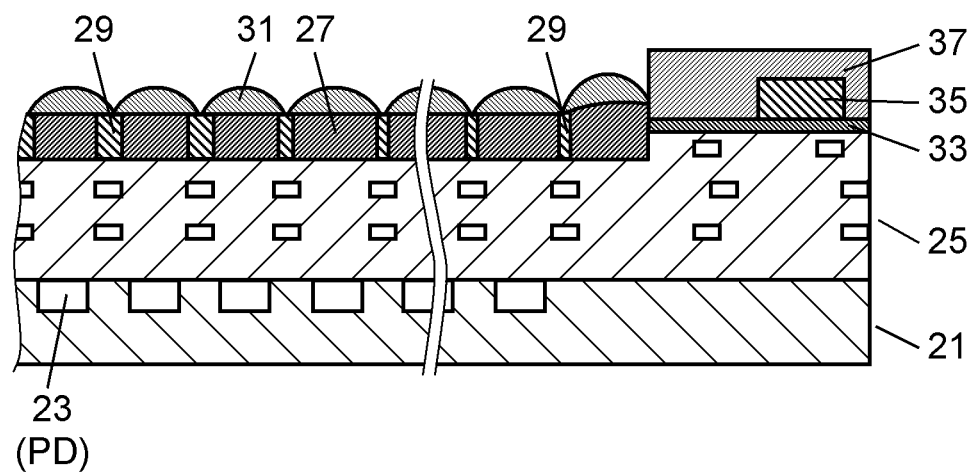
FIG. 5B is a sectional view for explaining the method for manufacturing the solid-state imaging device according to the first exemplary embodiment.

(f) As shown in FIG. 5B, finally, microlens 31 is formed on upper surfaces of color filter 27 and partition wall 29. Consequently, it is possible to manufacture solid-state imaging device 1 described in the example mentioned above.

Microlens 31 is formed every pixel part by applying the lens forming material and carrying out the exposure and the development. A lens forms a spherical surface through heating at 150° C. to 300° C. The spherical surface can also be formed by using an exposure using a gray scale mask or an etching-back technique.

5. Others

Although partition wall 29 is formed by a resin having a photosensitivity in the present exemplary embodiment, partition wall 29 can be formed to have a predetermined shape and size through dry etching or the like when partition wall 29 is to be formed by using a non-photosensitive material having no photosensitivity, for example.

Second Exemplary Embodiment

In the first exemplary embodiment, partition wall 29 is constituted by resin material 51, and furthermore, partition wall 29 has a width which is varied in a cross section between valid pixel region 11 and invalid pixel region 9.

However, a material of the partition wall is not restricted to the resin material but another material, for example, an inorganic material may be utilized. In addition, it is sufficient that the partition wall 29 is formed in at least a valid pixel region 11 and the partition wall 29 in the invalid pixel region 9 can suppress a film thickness unevenness caused by a flow of a filter forming resin due to a step between the pixel region 3 and a peripheral circuit region 5 in a formation of a color filter 27 and does not need to be always provided.

Figure 6A:
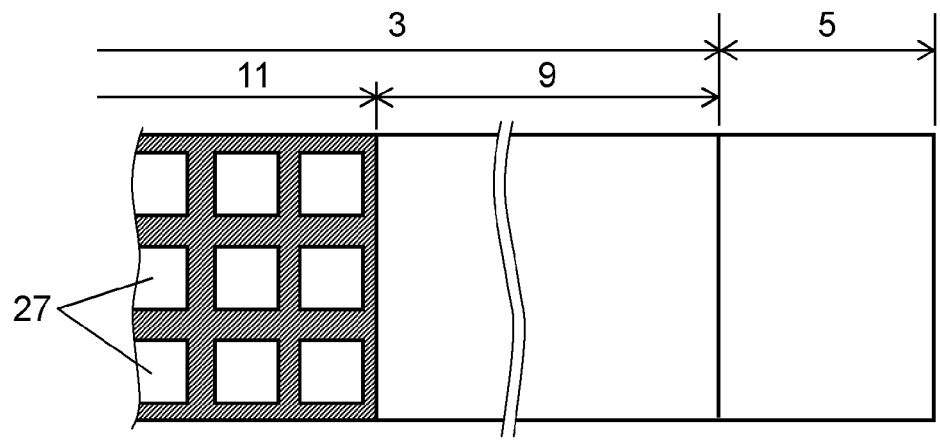
FIG. 6A is an enlarged view showing a portion corresponding to a 2A part in FIG. 1 and a plan view showing a state in which a microlens is removed in a solid-state imaging device according to a second exemplary embodiment.
Figure 6B:
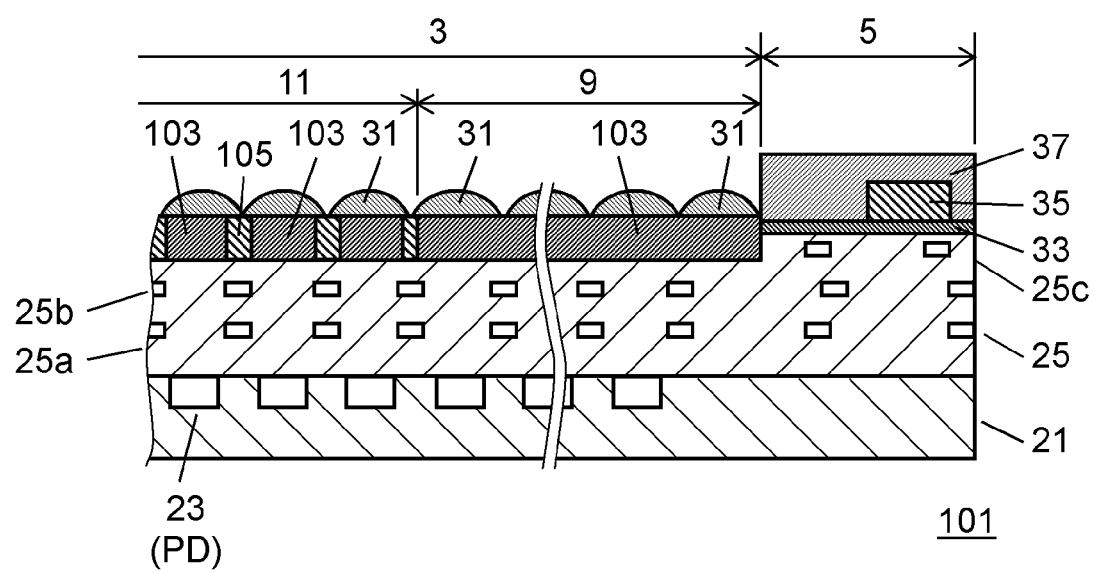
FIG. 6B is a sectional view corresponding to 2B-2B line in FIG. 1 showing the state in which the microlens is formed in the solid-state imaging device according to the second exemplary embodiment.

As shown in FIG. 6A and 6B, solid-state imaging device 101 according to a second exemplary embodiment includes semiconductor substrate 21, and wiring layer 25 to be a ground layer which is formed on semiconductor substrate 21 and has an upper surface corresponding to pixel region 3 and being lower than an upper surface corresponding to peripheral circuit region 5. There are provided a plurality of color filters 103 disposed two-dimensionally on the upper surface of wiring layer 25 corresponding to pixel region 3 and partition wall 105 disposed between respective color filters 103 present in valid pixel region 11 to be a central portion excluding invalid pixel region 9 to be an outer portion which is located adjacent to peripheral circuit region 5.

In the second exemplary embodiment, description will be given to solid-state imaging device 101 in which partition wall 105 is constituted by an inorganic material and the partition wall is not formed in invalid pixel region 9.

FIG. 6A is an enlarged view showing a corresponding portion to 2A of FIG. 1 in solid-state imaging device 101 according to the second exemplary embodiment and is a plan view showing a state in which a microlens is removed. FIG. 6B is a sectional view corresponding to the 2B-2B line of FIG. 1 showing a state in which the microlens is formed in solid-state imaging device 101 according to the second exemplary embodiment.

Solid-state imaging device 101 has pixel region 3 and peripheral circuit region 5, and pixel region 3 has valid pixel region 11 and invalid pixel region 9 in the same manner as in the first exemplary embodiment.

Solid-state imaging device 101 has semiconductor substrate 21 which is the same as that of the first exemplary embodiment and wiring layer 25 formed on the upper surface of the semiconductor substrate.

Partition wall 105 is formed on wiring layer 25 in valid pixel region 11. A shape and a dimension of partition wall 105 are the same as those of partition wall 29 formed in valid pixel region 11 described in the first exemplary embodiment. In the second exemplary embodiment, the partition wall is not formed in invalid pixel region 9 as described above.

Partition wall 105 is constituted by an inorganic material, for example, an inorganic material containing silicon oxide. Partition wall 105 can be obtained by forming a silicon oxide film over an almost whole surface of wiring layer 25 in pixel region 3 and etching a portion other than a portion corresponding to the partition wall.

More specific description will be given. Partition wall 105 is a silicon oxide film (TEOS film) deposited by a plasma CVD (Chemical Vapor Deposition) method using TEOS (Tetra Ethyl Ortho Silicate) as a raw material. Then, a resist pattern corresponding to partition wall 105 is formed on a silicon oxide film by a lithographic technique and a portion other than partition wall 105 is removed by plasma etching or the like, for example. Consequently, partition wall 105 is formed.

Color filter 103 is formed between partition walls 105 above light receiving part 23 of semiconductor substrate 21 corresponding to light receiving part 23 in valid pixel region 11 in the same manner as in the first exemplary embodiment. A film formed by the same material as a color filter is provided over the whole invalid pixel region 9.

Color filter 103 is formed by utilizing an acrylic resin mixing a pigment through the method described in the first exemplary embodiment in the same manner as in the first exemplary embodiment. Microlens 31 is formed on color filter 103 and partition wall 105 in the same manner as in the first exemplary embodiment.

Also in the second exemplary embodiment, in invalid pixel region 9, a space capable of storing a filter forming material (for example, an acrylic resin) can be enlarged more greatly than in the case in which a partition wall having the same width as that of partition wall 29 in valid pixel region 11 is formed over wiring layer 25 in a whole range of pixel region 3.

In a region of invalid pixel region 9 which is close to peripheral circuit region 5, consequently, partition wall 105 of invalid pixel region 9 is not provided. Therefore, the filter forming material can be stored in a larger quantity and a film thickness of color filter 103 can be made uniform from the region of invalid pixel region 9 which is close to peripheral circuit region 5.

Third Exemplary Embodiment

In the first and second exemplary embodiments, wiring layer 25 is disposed on light receiving part 23 of semiconductor substrate 21. However, in order to enhance a light propagation efficiency of light incident on a microlens to a photodiode, a portion positioned above the photodiode in the wiring layer may have an optical waveguide including a core part formed by a material having a higher refractive index than an interlayer insulating film of the wiring layer.

Description will be given by taking solid-state imaging device 201 including the optical waveguide as a third exemplary embodiment.

Figure 7:
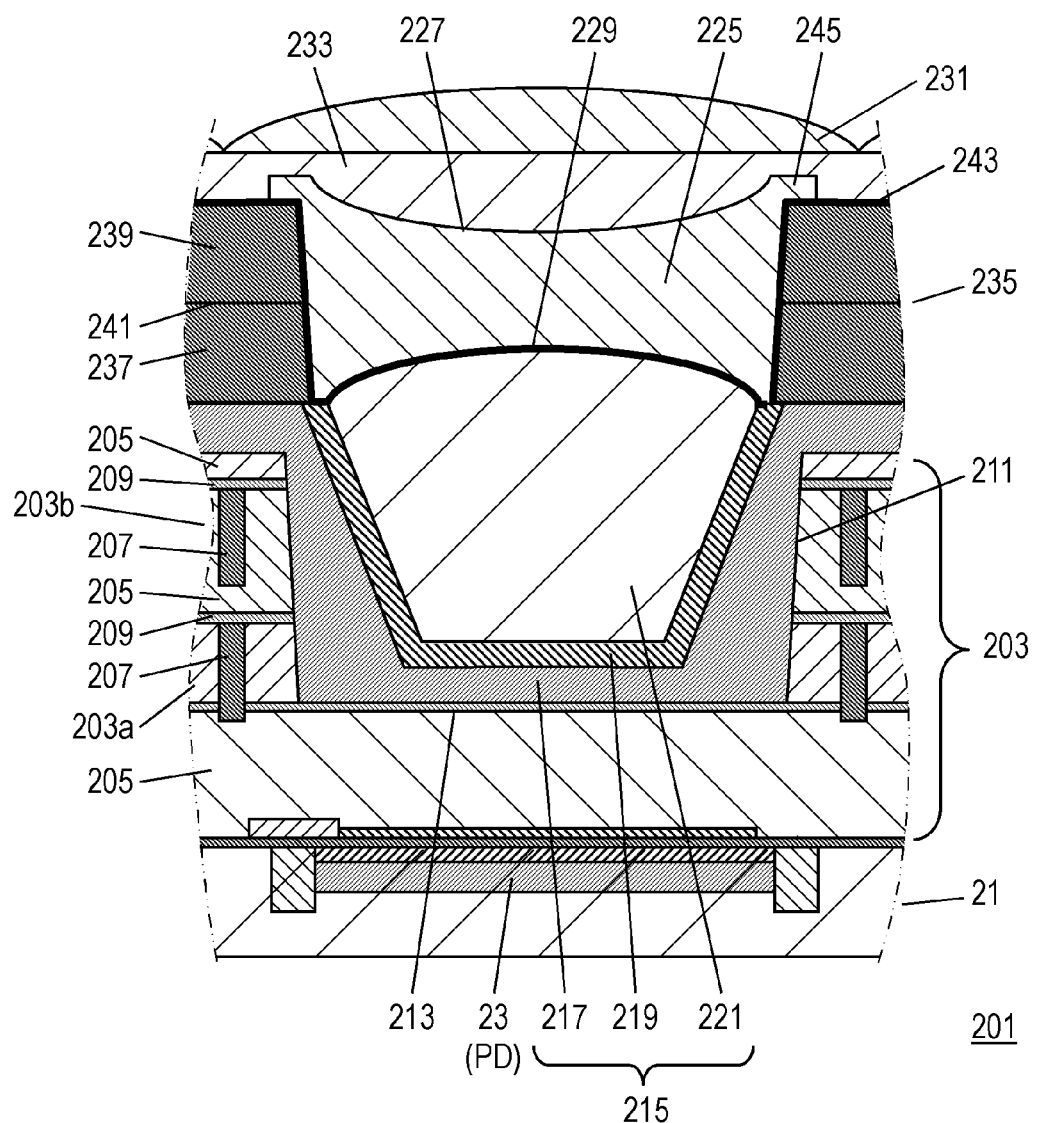
FIG. 7 is an enlarged view showing a single pixel part of a solid-state imaging device according to a third exemplary embodiment.

FIG. 7 is an enlarged view showing a single pixel part of solid-state imaging device 201 according to the third exemplary embodiment.

Solid-state imaging device 201 has wiring layer 203 on semiconductor substrate 21. Wiring layer 203 has a two-layer structure including first layer 203a and second layer 203b in pixel region 3, and each of layers 203a and 203b has insulating film 205, wiring 207 and diffusion preventing film 209.

Herein, a copper wire is utilized as wiring 207 and diffusion preventing film 209 prevents a copper atom from being diffused from the copper wire to insulating film 205 or the like.

Concave part 211 for the waveguide is formed on photodiode PD in wiring layer 203.

In wiring layer 203, a film to be a reference in the formation of concave part 211 is provided in a portion corresponding to a bottom of concave part 211. More specifically, there is formed etching stop film 213 for regulating etching in the formation of concave part 211 through the etching.

Insulating layer 215 is formed in concave part 211 of wiring layer 203. Insulating layer 215 has a layer structure. More specifically, insulating layer 215 has first insulating film 217 formed to cover a surface of wiring layer 203 and a bottom surface and a side surface constituting concave part 211, and second insulating film 219 formed on an upper surface of first insulating film 217 in concave part 211. Insulating layer 215 has third insulating part 221 disposed in concave part 211 in which first and second insulating films 217 and 219 are formed.

Referring to refractive indices of first insulating film 217, second insulating film 219 and third insulating part 221, the refractive index of second insulating film 219 is lower than that of first insulating film 217, and the refractive index of third insulating part 221 is higher than that of second insulating film 219.

Consequently, light incident on second insulating film 219 from third insulating part 221 is propagated in first insulating film 217 and is thus emitted from photodiode PD side in a relationship between the refractive indices of first insulating film 217 and second insulating film 219.

In color filter 225 provided above photodiode PD, upper surface 227 is dented toward the semiconductor substrate 21 side and lower surface 229 is dented toward a microlens 231 side. In other words, color filter 225 takes a shape of a concave lens. Consequently, light refracted by microlens 231 is refracted by color filter 225 so as to advance toward photodiode PD more greatly.

Third insulating part 221 takes a protruding shape toward the microlens 31 side along a concave shape of lower surface 229 of color filter 225. Moreover, flattened film 233 intended for flattening is formed on upper surface 227 of color filter 225.

Partition wall 235 takes a shape of a trapezoid in which a width on the microlens 231 side is smaller than that on the semiconductor substrate 21 side in a cross-sectional shape as shown in FIG. 7. In other words, partition wall 235 takes a shape of a trapezoid in which the width is gradually reduced from the semiconductor substrate 21 side to microlens 231 side.

Partition wall 235 has a multilayer structure, that is, a two-layer structure, for example. In other words, partition wall 235 has lower layer part 237 which is close to semiconductor substrate 21 and upper layer part 239 which is close to microlens 231. A refractive index of upper layer part 239 is higher than that of lower layer part 237.

As mentioned above, partition wall 235 has a refractive index which is lower than that of color filter 225, and prevents light from being incident on partition wall 235 from color filter 225 and cannot completely suppress the incidence of the light as described in the first exemplary embodiment. In other words, there is light entering an inner part of partition wall 235 and advancing from an upper portion to a lower portion in partition wall 235.

The light advancing from the upper portion to the lower portion in partition wall 235, that is, light advancing in upper layer part 239 toward lower layer part 237 is reflected toward the microlens 231 side through interface 241 between lower layer part 237 and upper layer part 239. Therefore, it is possible to prevent light from being incident on an adjacent pixel part via partition wall 235.

Although interface 241 is formed along a main surface (a layer on a wiring layer side) of semiconductor substrate 21, it is sufficient that the incidence of the light from upper layer part 239 to lower layer part 237 can be suppressed. In other words, interface 241 may be parallel with the main surface of semiconductor substrate 21 or may be inclined by an angle of approximately ±5 degrees or less with respect to the main surface of semiconductor substrate 21.

In the case in which materials of lower layer part 237 and upper layer part 239 are different from each other, interface 241 is formed between both of them. Further, even if the materials of lower layer part 237 and upper layer part 239 are identical to each other, interface 241 is formed between a reformed layer obtained by reforming an upper surface of lower layer part 237 (a surface on upper layer part 239 side) through plasma etching or the like and the upper layer part, for example.

Between partition wall 235 and color filter 225, and third insulating part 221 of insulating layer 215 and color filter 225, there is formed adhesion layer 243 for enhancing their adhesive properties. Particularly, in the case in which partition wall 235 and insulating layer 215 (especially, third insulating part 221) are constituted by inorganic materials and color filter 225 is constituted by an organic material having a small bonding force to the inorganic material, a bonding force of the inorganic material and the organic material is small. Therefore, by using the organic material having a great bonding force to the inorganic material, it is possible to increase a bonding force of partition wall 235 and color filter 225 or insulating layer 215 and color filter 225. Adhesion layer 243 specifically includes an epoxy resin, an acrylic resin, an urethane resin and the like.

Moreover, color filter 225 is overhung (overhung part 245) to an upper surface of partition wall 235 at an interval from another adjacent color filter 225 over the upper surface of partition wall 235 so that a coupling area of color filter 225 and partition wall 235 is increased.

Variant

Although the typical modes have been described in the first to third exemplary embodiments, the present invention is not restricted to the structures but may employ the following mode, for example.

1. Wiring Layer

Although the wiring layer 25 or 203 according to each of the exemplary embodiments has two layers in the pixel region 3 and has three layers in the peripheral circuit region 5, the wiring layer 25 or 203 may be properly determined depending on a size of a semiconductor substrate, a size of a single pixel or the like. In other words, in the case in which a space to be wired has a margin, the pixel region 3 and the peripheral circuit region 5 may have a two-layer structure (in this case, the step between the pixel region 3 and the peripheral circuit region 5 is decreased so that the film thickness unevenness of the color filter 27, 103 or 225 is reduced). In the case in which the size of the single pixel is small and there is no wiring space between the pixels, the pixel region 3 may have a multilayer structure including three layers or more. For the material of the wiring layer 25 or 203 or the like, it is also possible to use a material other than those described in the exemplary embodiments.

2. Interlayer Insulating Film and Protective Film

Although the interlayer insulating film 33 and the protective film 37 are constituted by the same material, that is, a silicon oxide film in the first exemplary embodiment, they may be constituted by separate materials respectively. For example, the interlayer insulating film 33 and the protective film 37 may be constituted by a silicon oxide film and a silicon oxynitride film respectively or the interlayer insulating film 33 and the protective film 37 may be constituted by the silicon oxynitride film and the silicon oxide film respectively.

Partition wall 235 described in the third exemplary embodiment has the two-layer structure including lower layer part 237 and upper layer part 239. In this case, by constituting the lower layer part 237 and the upper layer part 239 with the same materials as the interlayer insulating film 33 and the protective film 37 respectively, it is possible to form a two-layer structure serving as a base of the partition wall by utilizing the formation of the interlayer insulating film 33 and the protective film 37.

3. Partition Wall
(1) Material

Although the acrylic resin to be a photosensitive resin has been utilized as the organic material constituting the partition wall 29 in the first exemplary embodiment, the partition wall 29 may be constituted by another organic material. The another organic material may be an organic polymeric resin containing silica oxide or fluorine, for example, and the polymeric resin includes a polystyrene resin, a polyolefin resin, a polycarbonate resin and the like, for example. These materials have refractive indices which are lower than 1.5.

Although the silicon oxide (the silicon oxide film) has been utilized as the inorganic material constituting the partition wall 105 in the second exemplary embodiment, the partition wall 105 may be constituted by another inorganic material. The other inorganic material includes silicon nitride (a silicon nitride film), silicon oxynitride (a silicon oxynitride film) and the like, for example.

However, it is necessary to have an original function for reflecting light transmitted from a color filter side toward a light receiving part side and it is preferable to use a material having a lower refractive index than a refractive index of a color filter 27 or 103. In consideration of the refractive index of the color filter, it is preferable that a refractive index of the partition wall 29 or 105 should be equal to or lower than 1.6. Furthermore, it is more preferable that the refractive index of the partition wall 29 or 105 should be equal to or lower than 1.5.

(2) Number of Layers

Partition walls 29 and 105 have had the single-layer structure in the first and second exemplary embodiments and partition wall 235 has had the two-layer structure of lower layer part 237 and upper layer part 239 in the third exemplary embodiment (if the upper surface of lower layer part 237 is reformed, they have a three-layer structure as a whole). However, partition wall 29, 105 or 235 may have a structure including three layers or more. For example, partition wall may have a three-layer structure including a lower layer part, a middle layer part and an upper layer part and the middle layer part may be a reflecting layer, for example. Moreover, the refractive index may be gradually increased in accordance with a transition from the lower layer part to the upper layer part. To the contrary, the refractive index may be gradually reduced in accordance with the transition from the lower layer part to the upper layer part and a reflecting surface (a reflecting layer) may be provided in a middle layer.

(3) Shape

Although the cross-sectional shape of the partition wall has been set to be the rectangular shape in the first and second exemplary embodiments and has been set to be the trapezoidal shape in the third exemplary embodiment, the cross-sectional shape of the partition wall 29, 105 or 235 may be another shape. The other sectional shape includes a triangular shape, a shape obtained by dividing an ellipse into a half and the like.

Furthermore, although the partition wall 29, 105 or 235 has taken the shape of the grid as seen on a plane and the color filter 23 or 103 has been formed on the opening taking the square shape, the opening may take a shape other than the square shape, for example, a rectangular shape, a circular shape, an elliptical shape, a polygonal shape or the like. Moreover, in the case in which a planar shape of the opening takes the rectangular shape or the polygonal shape, a corner portion may be rounded.

(4) Size

Partition wall 29 of invalid pixel region 9 according to the first exemplary embodiment has taken the same cross-sectional shape and the same shape. However, it is sufficient that the partition wall 29 of the invalid pixel region 9 has an occupied area which is smaller than an occupied area of the partition wall 29 of the valid pixel region 11, and the shape and the size do not need to be always the same in the cross section.

Solid-state imaging devices 301 and 351 including partition walls having different shapes and sizes from each other will be described below as variants 1 and 2, respectively.

Figure 8:
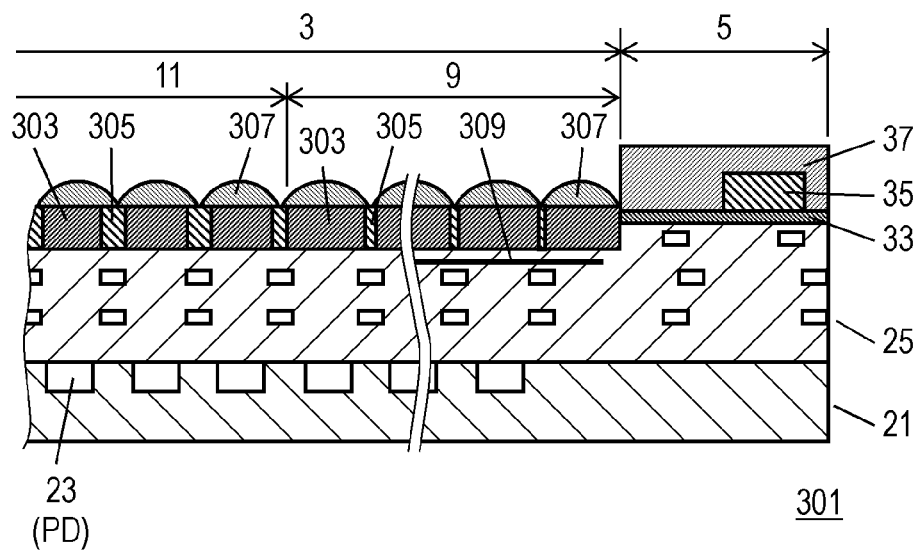
FIG. 8 is a sectional view showing a solid-state imaging device according to a variant 1.
Figure 9:
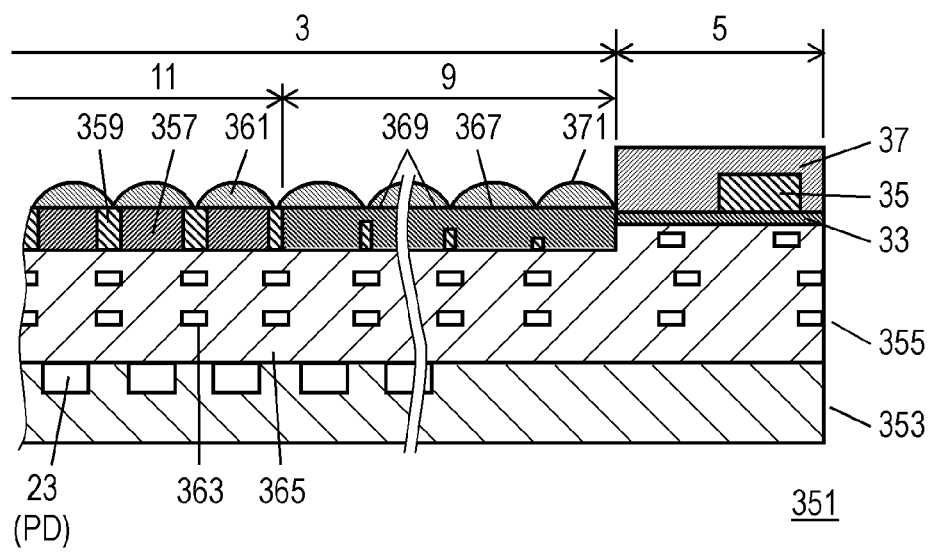
FIG. 9 is a sectional view showing a solid-state imaging device according to a variant 2.

FIG. 8 is a sectional view showing solid-state imaging device 301 according to the variant 1. FIG. 9 is a sectional view showing solid-state imaging device 351 according to the variant 2.

In the case in which explanation is given by using the same reference numerals as those in the structure described for each of solid-state imaging devices 1, 101 and 201, solid-state imaging devices 301 and 351 have the same structures as the structures having the same reference numerals described in the first to third exemplary embodiments.

Variant 1

As shown in FIG. 8, solid-state imaging device 301 has semiconductor substrate 21 and wiring layer 25. Pixel region 3 further has color filter 303, partition wall 305 and microlens 307, and peripheral circuit region 5 has interlayer insulating film 33, pad wiring 35 and protective film 37 in the same manner as in the exemplary embodiments.

A part of wiring layer 25 in invalid pixel region 9 has a region in which light shielding film 309 is formed, that is, a so-called optical black region. The optical black region serves to detect a black reference signal.

Color filters 303 are formed corresponding to photodiodes PDs respectively, and partition wall 305 is formed between color filters 303. Microlens 307 is formed on color filter 303 and partition wall 305.

Partition wall 305 of valid pixel region 11 has the same cross-sectional shape and size. Partition wall 305 of invalid pixel region 9 has a smaller occupied area than the partition wall of valid pixel region 11. In other words, although the sectional shape of partition wall 305 is the same shape as rectangular in both of regions 9 and 11, they are rectangular shapes in which a width of partition wall 305 in invalid pixel region 9 is smaller than that of partition wall 305 in valid pixel region 11.

Partition wall 305 of invalid pixel region 9 has the width reduced gradually toward peripheral circuit region 5. In other words, a space for storing a filter forming material for forming color filter 303 is gradually enlarged toward peripheral circuit region 5.

Variant 2

As shown in FIG. 9, solid-state imaging device 351 includes semiconductor substrate 353 and wiring layer 355. Pixel region 3 further has color filter 357, partition wall 359 and microlens 361, and peripheral circuit region 5 has interlayer insulating film 33, pad wiring 35 and protective film 37 in the same manner as in the exemplary embodiments.

Semiconductor substrate 353 has a plurality of light receiving parts (photodiodes PDs) in valid pixel region 11 and a region on the valid pixel region 11 side in invalid pixel region 9. Wiring layer 355 has wiring 363 in insulating film 365 between photodiodes PDs formed in semiconductor substrate 353. Also in the present variant 2, wiring layer 355 has a multilayer structure.

Color filter 357 is formed on semiconductor substrate 353 and above photodiode PD. Further, in a region of invalid pixel region 9 in which no photodiode PD is provided, dummy filter 367 is formed by the same material at an equal pitch to a pitch where color filter 357 is formed in valid pixel region 11.

Partition wall 359 is formed between respective color filters 357 and dummy partition wall 369 is formed between respective dummy filters 367.

Microlens 361 is formed on each color filter 357 and partition wall 359 and dummy microlens 371 is formed on dummy filter 367 and dummy partition wall 369. Dummy microlens 371 is formed in the same size, material and process as microlens 361.

Partition wall 359 of valid pixel region 11 has the same cross-sectional shape and size. Partition wall 359 and dummy partition wall 369 in invalid pixel region 9 have occupied areas which are smaller than an occupied area of partition wall 359 of valid pixel region 11. In other words, although sectional shapes of partition wall 359 and dummy partition wall 369 are the same shapes as rectangular in both of regions 9 and 11, they are rectangular shapes in which a height of partition wall 369 of invalid pixel region 9 is smaller than that of partition wall 359 of valid pixel region 11.

Dummy partition wall 369 in invalid pixel region 9 has heights reduced gradually toward peripheral circuit region 5. In other words, a space for storing a filter forming material for forming color filter 357 is gradually enlarged toward peripheral circuit region 5.

(5) Pitch

Although the pitch of the adjacent partition walls 29, 105, 235, 305 or 369 in invalid pixel region 9 is equal in the respective exemplary embodiments and the variants, the pitch of the partition walls may be increased gradually toward peripheral circuit region 5, for example. Similarly, the space for storing the filter forming material for forming the color filter can be enlarged gradually toward peripheral circuit region 5.

(6) Others

Figure 10:
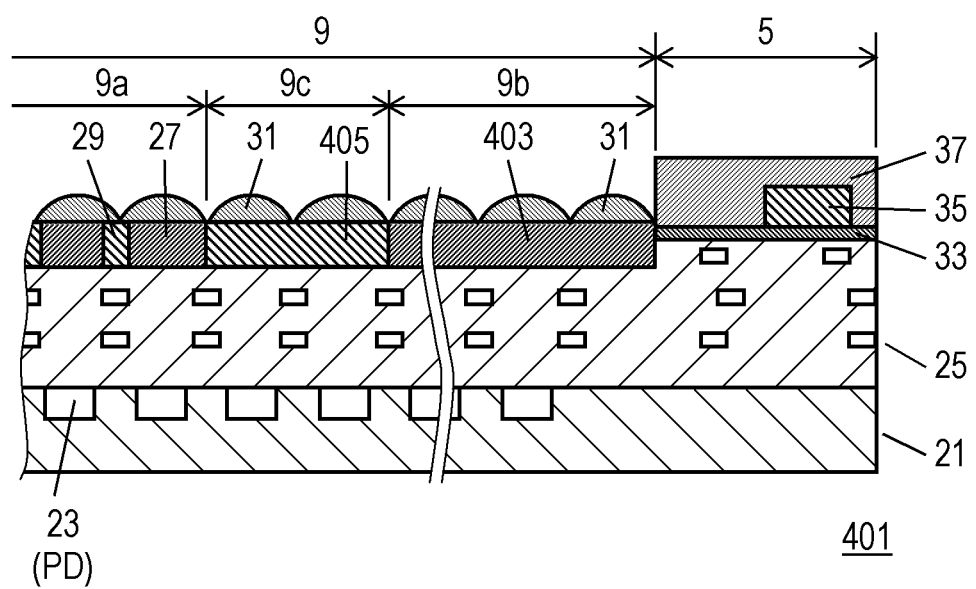
FIG. 10 is a sectional view showing a solid-state imaging device according to a variant 3.
Figure 11:
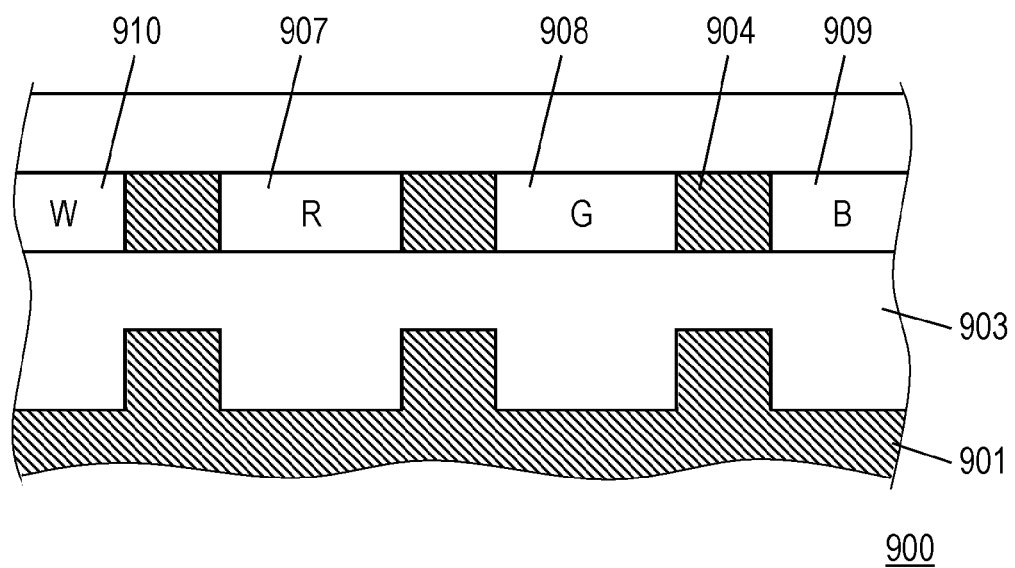
FIG. 11 is a sectional view showing the solid-state imaging device described in Unexamined Japanese Patent Publication No. 3-282403.

FIG. 10 is a sectional view showing solid-state imaging device 401 according to variant 3.

In the case in which explanation is given by using the same reference numerals as those in the structure described for each of solid-state imaging devices 1, 101, 201, 301 and 351, solid-state imaging device 401 has the same structure as the structures having the same reference numerals described in the first to third exemplary embodiments and the variants 1 and 2.

Solid-state imaging device 401 has semiconductor substrate 21 and wiring layer 25. Pixel region 3 further has color filters 27 and 403, partition walls 29 and 405, and microlens 31, and peripheral circuit region 5 has interlayer insulating film 33, pad wiring 35 and protective film 37 in the same manner as in the exemplary embodiments.

Although valid pixel region 11 is not shown in FIG. 10, a color filter and a partition wall in valid pixel region 11 have the same structures as those of color filter 27 according to the first exemplary embodiment and partition wall 29 according to the first exemplary embodiment, respectively. In other words, color filter 403 and partition wall 405 in invalid pixel region 9 are different.

In invalid pixel region 9, region 9a which is close to the valid pixel region has same color filter 27 and partition wall 29 which are the same as in valid pixel region 11. In invalid pixel region 9, a partition wall is not formed as described in the second exemplary embodiment but only color filter 403 is formed in region 9b which is close to peripheral circuit region 5. Consequently, it is possible to suppress a film thickness unevenness of color filter 27 which is close to peripheral circuit region 5.

In central region 9c of invalid pixel region 9, partition wall 405 is formed across a plurality of pixel parts, that is, two pixel parts in this case (it is sufficient that partition wall 405 has a larger cross-sectional area than that of a partition wall in valid pixel region 11). Consequently, the film thickness unevenness of color filter 27 which is close to peripheral circuit region 5 is suppressed by eliminating the partition wall in region 9b close to peripheral circuit region 5 to store a filter forming material in a larger quantity. For this reason, the larger quantity of the filter forming material is used in region 9b which is close to peripheral circuit region 5.

However, by forming partition wall 405 across the pixel parts, it is possible to reduce the quantity of the filter forming material to be used in region 9c. As a result, it is possible to suppress the film thickness unevenness of the color filter, and furthermore, to reduce the quantity of the filter forming material to be used.

4. Pixel Region

In the exemplary embodiments or the like, the pixel part is disposed in a two-dimensional arrangement, for example, a matrix. Although the width of the invalid pixel region 9 or the like has not been described in detail, the width of the invalid pixel region 9 may be equal in row and column directions or may be greater in either the row direction or the column direction.

For example, in the case in which the pixel region seen on a plane takes a square shape, all of the widths of the invalid pixel regions 9 corresponding to respective sides may be equal to each other or may be different from each other. Moreover, the invalid pixel regions 9 corresponding to the sides in the column direction may be identical to each other or the invalid pixel regions 9 corresponding to two sides interposing a certain corner therebetween may be identical to each other.

Even if the light receiving part 23 is formed on the semiconductor substrate, the light receiving part 23 is present in the invalid pixel region 9 if a pixel signal sent from the light receiving part 23 is not used as image information. Furthermore, it is assumed that a light receiving part 23 for detecting a signal for correcting an image signal or the like, for example, a black reference signal is also present in the invalid pixel region 9.

In other words, the invalid pixel region 9 is a region in which a light receiving part 23 having no relation to an output of an image or a calculation processing for the output is present.

The invalid pixel region 9 should be extended along the peripheral circuit region and should have a width which is equal to or greater than 1 μm and is equal to or smaller than 100 μm.

5. Solid-State Imaging Device

Although the CMOS type has been employed in the exemplary embodiments, a CCD type may be used, and furthermore, there may be utilized a light receiving part which is constituted by interposing a photoelectric converting film with upper and lower electrodes.

6. Others (1) Ground Layer

The ground layer according to the present invention implies a layer on which forms the color filter and the partition wall and is present on the grounds of the color filter and the partition wall, and wiring layer 25 and insulating layer 215 described in the first to third exemplary embodiments and the like correspond thereto.

However, in the case in which the flattened film is formed on the wiring layer 25 and the color filter and the partition wall are formed on the flattened film, the flattened film corresponds to the ground layer. In the case in which another layer is formed on the wiring layer 25 and the color filter and the partition wall are formed on the other layer, the other layer corresponds to the ground layer.

The ground layer may include interlayer insulating film 33, pad wiring 35 and protective layer 37 described in the first exemplary embodiment or does not need to always include them. In other words, if there is employed a structure in which a color film forming material is inclined from the peripheral circuit region 5 toward the pixel region 3 in the formation of the color filter 27, the structure of the ground layer in the peripheral circuit region 5 is not restricted.

(2) Pixel Region

The pixel region according to the present invention does not need to always have the light receiving part within a whole range of the region. An example in which the light receiving part is formed within the whole range of the pixel region indicates the first exemplary embodiment. Moreover, an example in which the light receiving part is not formed within the whole range of the pixel region indicates the variant 2.

Furthermore, all of image signals transmitted from all of the light receiving parts in the pixel region do not need to be used as video information for forming images. An example in which the image signal is not used as image information indicates the variant 1.

(3) Occupied Area

The occupied area according to the present invention indicates an area of a partition wall in an area within a predetermined range including the partition wall in a section which is orthogonal to the upper surface of the ground layer corresponding to the pixel region 3. It is sufficient that the predetermined range is a region including at least one partition wall in the case in which the area of the partition wall in an outer portion adjacent to the peripheral circuit region 5 is constant (this example indicates the first exemplary embodiment).

The predetermined range may be a region corresponding to the outer portion in the case in which the area of the partition wall in the outer portion is not constant (this example indicates the variant 1 and the variant 2) or may be a region including a single partition wall having the smallest area in the partition walls disposed in the outer portion.

However, in the case in which the area of the single partition wall is equal and the pitch of the partition walls in the outer portion is greater than the pitch of the walls in a central portion, the region needs to include at least two partition walls which are provided in the outer portion and have a different pitch.

The present invention can be widely utilized for preventing a thickness unevenness of a color filter in a solid-state imaging device having a partition wall provided between the color filters.

What is claimed is:

1. A solid-state imaging device comprising:
a semiconductor substrate;
a ground layer formed on the semiconductor substrate and having an upper surface corresponding to a pixel region, the upper surface being lower than an upper surface corresponding to a peripheral circuit region;
a plurality of color filters disposed two-dimensionally on the upper surface of the ground layer corresponding to the pixel region; and
a partition wall provided between the color filters,
wherein an occupied area of the partition wall provided in an outer portion of the pixel region adjacent to the peripheral circuit region is smaller than that of the partition wall provided in a central portion of the pixel region in a section which is orthogonal to the upper surface of the ground layer corresponding to the pixel region,
wherein the outer portion of the pixel region is extended along the peripheral circuit region and has a width which is equal to or greater than 1 micrometer and is equal to or smaller than 100 micrometers.

2. The solid-state imaging device according to claim 1, wherein an area of the partition wall in the outer portion is smaller than that of the partition wall in the central portion in the section.

3. The solid-state imaging device according to claim 2, wherein the partition wall is formed on the upper surface of the ground layer corresponding to the pixel region, and
a width of the partition wall in the outer portion of the pixel region is smaller than that of the partition wall in the central portion in the section.

4. The solid-state imaging device according to claim 2, wherein the partition wall is formed on the upper surface of the ground layer corresponding to the pixel region, and
a height of the partition wall in the outer portion of the pixel region is smaller than that of the partition wall in the central portion of the pixel region in the section.

5. The solid-state imaging device according to claim 1, wherein the area of the partition wall in the outer portion of the pixel region is gradually reduced toward the peripheral circuit region in the section.

6. A method for manufacturing a solid-state imaging device including a plurality of color filters and a partition wall, the color filters being disposed two-dimensionally on an upper surface of a ground layer corresponding to a pixel region, the ground layer having a structure in which the upper surface corresponding to the pixel region is lower than an upper surface corresponding to a peripheral circuit region, comprising:
a partition wall forming step of forming the partition wall in a state in which an occupied area of the partition wall provided in an outer portion of the pixel region adjacent to the peripheral circuit region is smaller than that of the partition wall provided in a central portion of the pixel region in a section which is orthogonal to the upper surface of the ground layer corresponding to the pixel region; and
a filter forming step of forming the color filter between the partition walls,
wherein the outer portion of the pixel region is extended along the peripheral circuit region and has a width which is equal to or greater than 1 micrometer and is equal to or smaller than 100 micrometers.

7. A solid-state imaging device comprising:
a semiconductor substrate;
a ground layer formed on the semiconductor substrate and having an upper surface corresponding to a pixel region, the upper surface being lower than an upper surface corresponding to a peripheral circuit region;
a plurality of color filters disposed two-dimensionally on the upper surface of the ground layer corresponding to the pixel region; and
a partition wall provided between the color filters which are present in a central portion of the pixel region excluding an outer portion of the pixel region adjacent to the peripheral circuit region,
wherein the outer portion of the pixel region is extended along the peripheral circuit region and has a width which is equal to or greater than 1 micrometer and is equal to or smaller than 100 micrometers.

8. A method for manufacturing a solid-state imaging device including a plurality of color filters and a partition wall, the color filters being disposed two-dimensionally on an upper surface of a ground layer corresponding to a pixel region, the ground layer having a structure in which the upper surface corresponding to the pixel region is lower than an upper surface corresponding to a peripheral circuit region and a partition wall, comprising:
- a partition wall forming step of forming the partition walls in a central portion of the pixel region excluding an outer portion adjacent to the peripheral circuit region; and
- a filter forming step of forming the color filter between the respective partition walls in the outer portion and the central portion,
- wherein the outer portion of the pixel region is extended along the peripheral circuit region and has a width which is equal to or greater than 1 micrometer and is equal to or smaller than 100 micrometers.

* * * * *